United States Patent
Shinohara et al.

(10) Patent No.: US 7,439,669 B2
(45) Date of Patent: Oct. 21, 2008

(54) LIGHT EMITTING MATERIAL, METHOD OF MANUFACTURING THE LIGHT EMITTING MATERIAL AND METHOD OF MANUFACTURING LIGHT EMITTING LAYER

(75) Inventors: Takashi Shinohara, Suwa (JP); Yuji Shinohara, Suwa (JP); Masamitsu Uehara, Shiojiri (JP); Masamitsu Shimazu, Matsumoto (JP); Ryuji Ishii, Chino (JP)

(73) Assignee: Seiko Epson Corporation, Tokyo (JP)

( * ) Notice: Subject to any disclaimer, the term of this patent is extended or adjusted under 35 U.S.C. 154(b) by 326 days.

(21) Appl. No.: 10/854,260

(22) Filed: May 27, 2004

(65) Prior Publication Data

US 2005/0012450 A1 Jan. 20, 2005

(30) Foreign Application Priority Data

May 29, 2003 (JP) ............................. 2003-153540
Aug. 8, 2003 (JP) ............................. 2003-206954

(51) Int. Cl.
*H01L 51/54* (2006.01)
*C09K 11/55* (2006.01)
*C09K 11/06* (2006.01)

(52) U.S. Cl. ...................... 313/504; 428/690; 428/917

(58) Field of Classification Search ................. 313/504, 313/505, 506; 428/690, 917
See application file for complete search history.

(56) References Cited

U.S. PATENT DOCUMENTS 6,641,933 B1 * 11/2003 Yamazaki et al. ........... 428/690
6,660,583 B2 * 12/2003 Fujino et al. ................ 438/253

FOREIGN PATENT DOCUMENTS

| EP | 1 063 869 A | 12/2000 |
| EP | 1 087 448 A | 3/2001 |
| JP | A 07-282977 | 10/1995 |
| JP | 2001-214159 A | 8/2001 |
| JP | A 2002-175885 | 6/2002 |

* cited by examiner

*Primary Examiner*—Karabi Guharay
(74) *Attorney, Agent, or Firm*—Oliff & Berridge, PLC

(57) ABSTRACT

An organic EL device with a voltage applied across an anode and a cathode so that holes are moved in a hole transport layer and electrons are moved in an electron transport layer, and the holes and the electrons are recombined in a light emitting layer to emit light. The light emitting layer is formed of light emitting material having one or more kinds of metallic impurities. By using such a light emitting material, the decrease of light-emission luminance of the organic EL device can be suppressed.

15 Claims, 1 Drawing Sheet

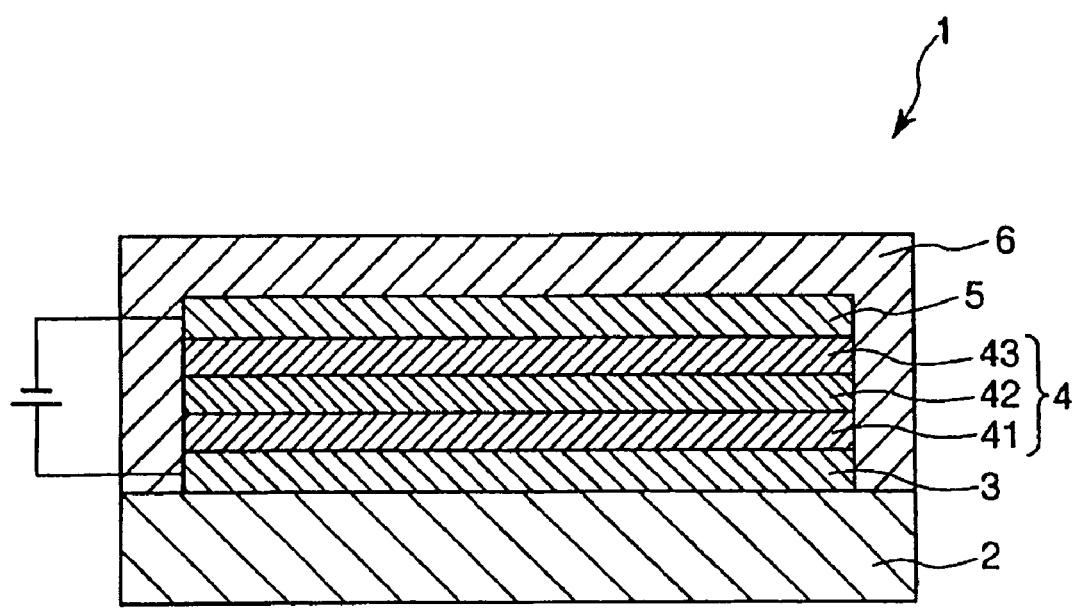

LIGHT EMITTING MATERIAL, METHOD OF MANUFACTURING THE LIGHT EMITTING MATERIAL AND METHOD OF MANUFACTURING LIGHT EMITTING LAYER

BACKGROUND OF THE INVENTION

1. Field of the Invention

The present invention relates to a light emitting material to be used for a light emitting layer provided in an organic electroluminescent device, a method of manufacturing the light emitting material, and a method of forming the light emitting layer.

2. Description of the Prior Art

There is known an organic electroluminescent device (hereinafter, referred to as an "organic EL device"). The organic EL device has a structure in which at least one light emitting organic layer (organic electroluminescent layer) is provided between a cathode and an anode. Such an organic EL device can significantly reduce a voltage to be applied as compared with an inorganic EL device. Further, it is also possible to manufacture devices that can provide various luminescent colors.

Currently, in order to obtain higher-performance organic EL devices, various researches are being actively carried out in developments and improvements of materials to be used as well as device structures thereof.

Up to now, organic EL devices that can provide various luminescent colors or organic EL devices that have high luminance and high efficiency have been already developed. However, in order to realize their various practical uses such as application to a picture element of a display or a light source, further researches are being carried out.

However, from the viewpoint of practical use, the existing organic EL devices still have a problem in that light-emission luminance thereof is decreased or deteriorated when it is used over a long period of time, and therefore there is a demand for the establishment of technical measures to solve the problem.

As for a method for suppressing the decrease of light-emission luminance of an organic EL device, a method using a high-purity organic compound has been proposed (see Japanese Patent Laid-open No. 2002-175885, for example). Japanese Patent Laid-open No. 2002-175885 discloses an organic EL device, in which the content of a halogen-containing compound (impurities) contained in a material constituting the device is made less than 1,000 ppm, thereby suppressing the decrease of light-emission luminance which will occur when it is used over a long period of time.

However, specific indexes of the relationship between the decrease of light-emission luminance in an organic EL device and the kinds of impurities contained in the constituent materials to be used and their amounts contained therein have not yet been established. Thus, further researches are being carried out toward realizing the practical uses.

SUMMARY OF THE INVENTION

It is therefore an object of the present invention to provide a light emitting material which can suppress the decrease of light-emission luminance in an organic EL device, a method of manufacturing the light emitting material, and a method of forming a light emitting layer which can provide a light emitting layer having excellent light-emitting performance easily and reliably.

In order to achieve the above object, the present invention is directed to a light emitting material to be used for a light emitting layer provided in an organic EL device, in which the light emitting material is characterized in that when the light emitting layer is formed using the light emitting material, the light emitting layer contains one or more kinds of metallic impurities, but an amount of a metallic impurity of which content is the largest among the metallic impurities contained in the layer is 2.5 ppm or less.

According to the invention described above, it is possible to provide a light emitting material by which the decrease of light-emission luminance in an organic EL device can be suppressed.

In the above light emitting material, it is preferred that the total amounts of the metallic impurities contained in the light emitting layer is 10 ppm or less. This makes it possible to suppress the decrease of light-emission luminance in an organic EL device more reliably.

Further, the metallic impurities to be eliminated include metal elements and metal ions. By removing such metallic impurities, it is possible to provide a light emitting material by which the decrease of light-emission luminance in an organic EL device can be suppressed more reliably.

In this case, it is preferred that the metal elements are main group elements. By removing the metallic impurities of these metals, the effect of suppressing the decrease of light-emission luminance can be exhibited especially conspicuously.

Further, it is also preferred that the light emitting material is in a solid form or a semi-solid form at room temperature. This makes it possible to prevent or suppress alternation and deterioration of the organic EL element with the elapse of time, so that the effect of suppressing the decrease of light-emission luminance can be improved.

Furthermore, in the present invention, it is also preferred that the organic EL device includes a transparent electrode, a thin film formed of the light emitting material, the thin film having a thickness of 50 nm and provided on the transparent electrode, and a metallic electrode provided on the thin film, wherein when a voltage of 6V is applied to the organic EL device, luminescence higher than $10\,cd/m^2$ is obtained. When an organic EL device manufactured using the light emitting material is applied to a display, for example, it is possible to obtain an image having high visibility.

Furthermore, in the present invention, it is preferred that the light emitting material includes a low-molecular light emitting material. Use of such a low-molecular light emitting material makes it possible to provide a dense light emitting layer, so that the light emitting performance of the light emitting layer can be improved.

In this case, it is preferred that the low-molecular light emitting material is selected from the group comprising benzene-based compounds, naphthalene-based compounds, phenanthrene-based compounds, chrysene-based compounds, perylene-based compounds, coronene-based compounds, anthracene-based compounds, pyrene-based compounds, pyran-based compounds, acridine-based compounds, stilbene-based compounds, thiophene-based compounds, benzooxazole-based compounds, benzoimidazole-based compounds, benzothiazole-based compounds, butadiene-based compounds, naphthalimide-based compounds, coumarin-based compounds, perynone-based compounds, oxadiazole-based compounds, aldazine-based compounds, cyclopentadiene-based compounds, quinacridone-based compounds, pyridine-based compounds, spiro compounds, metallic or non-metallic phthalocyanine-based compounds, florene-based compounds, and various metallic complexes.

Moreover, in the present invention, it is also preferred that the light emitting material includes a high-molecular light emitting material. Since such a high-molecular light emitting material is relatively easily dissolved in a solvent, it is possible to form a light emitting layer with various application methods such as an ink-jet printing method and the like.

In this case, it is preferred that the high-molecular light emitting material is selected from the group comprising polyacetylene-based compounds, polyparaphenylenevinylene-based compounds, polythiophene-based compounds, polyfluorene-based compounds, polyparaphenylene-based compounds, polycarbazole-based compounds, and polysilane-based compounds.

Moreover, in the present invention, it is preferred that the thickness of the light emitting layer is in the range of 10 to 150 nm. The light emitting material of the present invention is particularly useful in forming such a relatively thin light emitting layer.

Another aspect of the present invention is directed to a light emitting material to be used for a light emitting layer provided in an organic EL device, in which the light emitting material is characterized in that when the light emitting material is dissolved in a liquid so that the concentration thereof becomes 2.0 wt %, the liquid contains one or more kinds of metallic impurities, but an amount of the metallic impurity of which content is the largest among the metallic impurities contained in the liquid is 50 ppb or less.

According to the invention described above, it is possible to provide a light emitting material by which the decrease of light-emission luminance in an organic EL device can be suppressed.

In the above light emitting material, it is preferred that the total amounts of the metallic impurities contained in the liquid is 200 ppb or less. This makes it possible to suppress the decrease of light-emission luminance in an organic EL device more reliably.

Further, the metallic impurities to be eliminated include metal elements and metal ions. By removing such metallic impurities, it is possible to provide a light emitting material by which the decrease of light-emission luminance in an organic EL device can be suppressed more reliably.

In this case, it is preferred that the metal elements are main group elements. By removing the metallic impurities of these metals, the effect of suppressing the decrease of light-emission luminance can be exhibited especially conspicuously.

Further, it is also preferred that the light emitting material is in a solid form or a semi-solid form at room temperature. This makes it possible to prevent or suppress alternation and deterioration of the organic EL element with the elapse of time, so that the effect of suppressing the decrease of light-emission luminance can be improved.

Furthermore, in the present invention, it is also preferred that the organic EL device includes a transparent electrode, a thin film formed of the light emitting material, the thin film having a thickness of 50 nm and provided on the transparent electrode, and a metallic electrode provided on the thin film, wherein when a voltage of 6V is applied to the organic EL device, luminescence higher than 10 cd/m$^2$ is obtained. When an organic EL device manufactured using the light emitting material is applied to a display, for example, it is possible to obtain an image having high visibility.

Furthermore, in the present invention, it is preferred that the light emitting material includes a low-molecular light emitting material. Use of such a low-molecular light emitting material makes it possible to provide a dense light emitting layer, so that the light emitting performance of the light emitting layer can be improved.

In this case, it is preferred that the low-molecular light emitting material is selected from the group comprising benzene-based compounds, naphthalene-based compounds, phenanthrene-based compounds, chrysene-based compounds, perylene-based compounds, coronene-based compounds, anthracene-based compounds, pyrene-based compounds, pyran-based compounds, acridine-based compounds, stilbene-based compounds, thiophene-based compounds, benzooxazole-based compounds, benzoimidazole-based compounds, benzothiazole-based compounds, butadiene-based compounds, naphthalimide-based compounds, coumarin-based compounds, perynone-based compounds, oxadiazole-based compounds, aldazine-based compounds, cyclopentadiene-based compounds, quinacridone-based compounds, pyridine-based compounds, spiro compounds, metallic or non-metallic phthalocyanine-based compounds, florene-based compounds, and various metallic complexes.

Moreover, in the present invention, it is also preferred that the light emitting material includes a high-molecular light emitting material. Since such a high-molecular light emitting material is relatively easily dissolved in a solvent, it is possible to form a light emitting layer with various application methods such as an ink-jet printing method and the like.

In this case, it is preferred that the high-molecular light emitting material is selected from the group comprising polyacetylene-based compounds, polyparaphenylenevinylene-based compounds, polythiophene-based compounds, polyfluorene-based compounds, polyparaphenylene-based compounds, polycarbazole-based compounds, and polysilane-based compounds.

Moreover, in the present invention, it is preferred that the thickness of the light emitting layer is in the range of 10 to 150 nm. The light emitting material of the present invention is particularly useful in forming such a relatively thin light emitting layer.

Furthermore, yet another aspect of the present invention is directed to a method of manufacturing a light emitting material to be used for a light emitting layer provided in an organic EL device, which comprises the steps of:

preparing a liquid in which a light emitting material is dissolved in a solvent; and eliminating one or more kinds of metallic impurities contained in the liquid by means of eliminating means which separates or eliminates the metallic impurities, and then removing the solvent from the liquid, thereby refining the light emitting material to obtain a refined light emitting material to be used for the light emitting layer of the organic EL device.

According to the manufacturing method of the present invention described above, it is possible to eliminate the metallic impurities contained in the light emitting material easily in a relatively short period of time. Further, by appropriately selecting the kind of the eliminating means to be used, it is possible to eliminate target metallic impurities efficiently and reliably.

The present invention is also directed to a method of manufacturing a light emitting material to be used for a light emitting layer provided in an organic EL device, which comprises the steps of:

preparing a liquid in which a light emitting material is dissolved in a solvent; and eliminating one or more kinds of metallic impurities contained in the liquid by means of eliminating means which separates or eliminates the metallic impurities, and then removing the solvent from the liquid, thereby refining the light emitting material to obtain a refined light emitting material to be used for the light emitting layer of the organic EL device, wherein thus obtained refined light emitting material being characterized in that when the light emitting layer is formed using the light emitting material, the light emitting layer contains one or more kinds of metallic impurities, but an amount of a metallic impurity of which content is the largest among the metallic impurities contained in the layer is 2.5 ppm or less.

Further, the present invention is also directed to a method of manufacturing a light emitting material to be used for a light emitting layer provided in an organic EL device, which comprises the steps of:

preparing a liquid in which a light emitting material is dissolved in a solvent; and eliminating one or more kinds of metallic impurities contained in the liquid by means of eliminating means which separates or eliminates the metallic impurities, and then removing the solvent from the liquid, thereby refining the light emitting material to obtain a refined light emitting material to be used for the organic EL device, wherein thus obtained refined light emitting material being characterized in that when the light emitting material is dissolved in a liquid so that the concentration thereof becomes 2.0 wt %, the liquid contains one or more kinds of metallic impurities, but an amount of the metallic impurity of which content is the largest among the metallic impurities contained in the liquid is 50 ppb or less.

Other aspect of the present invention is directed to a method of forming a light emitting layer provided in an organic EL device, which comprises the steps of:

preparing a light emitting material as defined in any one of claims 1 to 16;

preparing a liquid in which the light emitting material is dissolved in a solvent; and forming a light emitting layer of the organic EL device by applying the liquid and then drying it.

According to the method described above, it is possible to form a light emitting layer having an excellent light emitting performance easily and reliably.

These and other objects, structures and advantages of the present invention will be apparent from the following detailed description of the invention and the examples thereof which proceeds with reference to the accompanying drawing.

BRIEF DESCRIPTION OF THE DRAWINGS

The FIGURE is a cross-sectional view which shows an example of an organic EL device.

DETAILED DESCRIPTION OF THE INVENTION

First, before discussing the details of the light emitting material, the method of manufacturing such a light emitting material, and the method of forming a light emitting layer of the present invention, an example of an organic EL device (organic electroluminescent device) which has a light emitting layer formed using a light emitting material of the present invention will be described.

<Organic EL Device>

The FIGURE is a cross-sectional view which shows an example of an organic EL device.

An organic EL device 1 shown in the FIGURE includes a transparent substrate 2, an anode 3 provided on the substrate 2, an organic EL layer 4 provided on the anode 3, a cathode 5 provided on the organic EL layer 4 and a protection layer 6 provided so as to cover these layers 3, 4 and 5.

The substrate 2 serves as a support of the organic EL device 1, and the layers described above are formed on this substrate 2.

As a constituent material of the substrate 2, a material having a light transmitting property and a good optical property can be used. Examples of such a material include various resin materials such as polyethylene terephthalate, polyethylene naphthalate, polypropylene, cycloolefin polymer, polyamide, polyether sulfone, polymethyl methacrylate, polycarbonate, and polyarylate, various glass materials, and the like. These materials can be used singly or in combination of two or more of them.

The thickness of the substrate 2 is not limited to any specific value, but is preferably in the range of about 0.1 to 30 mm, more preferably in the range of about 0.1 to 10 mm.

The anode 3 is an electrode which injects holes into the organic EL layer 4 (that is, into a hole transport layer 41 described later). Further, this anode 3 is made substantially transparent (which includes colorless and transparent, colored and transparent, or translucent) so that light emission from the organic EL layer 4 (that is, from a light emitting layer 42 described later) can be visually identified.

From such a viewpoint, a material having a high work function, excellent conductivity and a light transmitting property is preferably used as a constituent material of the anode 3 (hereinafter, referred to as "anode material").

Examples of such an anode material include oxides such as ITO (Indium Tin Oxide), $SnO_2$, Sb-containing $SnO_2$ and Al-containing ZnO, Au, Pt, Ag, Cu, and alloys containing two or more of them. These materials can be used singly or in combination of two or more of them.

The thickness of the anode 3 is not limited to any specific value, but is preferably in the range of about 10 to 200 nm, more preferably in the range of about 50 to 150 nm. If the thickness of the anode 3 is too thin, there is a fear that a function as the anode 3 is not sufficiently exhibited. On the other hand, if the anode 3 is too thick, there is a fear that light transmittance is significantly lowered depending on the kind of anode material used, or the like, thus resulting in an organic EL device that can not be suitably used for practical use.

It is to be noted that conductive resins such as polythiophene, polypyrrole, and the like can also be used for the anode material, for example.

On the other hand, the cathode 5 is an electrode which injects electrons into the organic EL layer 4 (that is, into an electron transport layer 43 described later).

As a constituent material of the cathode 5 (hereinafter, referred to as "cathode material"), a material having a low work function is preferably used.

Examples of such a cathode material include Li, Mg, Ca, Sr, La, Ce, Er, Eu, Sc, Y, Yb, Ag, Cu, Al, Cs, Rb, and alloys containing two or more of them. These materials can be used singly or in combination of two or more of them.

Particularly, in a case where an alloy is used as the cathode material, an alloy containing a stable metallic element such as Ag, Al or Cu, namely an alloy such as MgAg, AlLi or CuLi is preferably used. The use of such an alloy as the cathode material makes it possible to improve the electron injection efficiency and stability of the cathode 5.

The thickness of the cathode 5 is preferably in the range of about 1 nm to 1 µm, more preferably in the range of about 100 to 400 nm. If the thickness of the cathode 5 is too thin, there is a fear that a function as the cathode 5 is not sufficiently exhibited. On the other hand, if the cathode 5 is too thick, there is a fear that the light emitting efficiency is lowered.

Between the anode 3 and the cathode 5, there is provided the organic EL layer 4. The organic EL layer 4 includes the hole transport layer 41, the light emitting layer 42, and the electron transport layer 43. These layers 41, 42 and 43 are formed on the anode 3 in this order.

The hole transport layer 41 has the function of transporting holes, which are injected from the anode 3, to the light emitting layer 42.

Examples of a constituent material for such a hole transport layer 41 (hereinafter, referred to as "hole transport material") include: arylcycloalkane-based compounds such as 1,1-bis (4-di-para-triaminophenyl)cyclohexane and 1,1'-bis(4-di-para-tolylaminophenyl)-4-phenyl-cyclohexane; arylamine-based compounds such as 4,4',4"-trimethyltriphenylamine, N,N,N',N'-tetraphenyl-1,1'-biphenyl-4,4'-diamine, N,N'-diphenyl-N,N'-bis(3-methylphenyl)-1,1'-biphenyl-4,4'-diamine(TPD1), N,N'-diphenyl-N,N'-bis(4-methoxyphenyl)-1,1'-biphenyl-4,4'-diamine(TPD2), N,N,N',N'-tetrakis(4-methoxyphenyl)-1,1'-biphenyl-4,4'-diamine(TPD3), N,N'-di (1-naphthyl)-N,N'-diphenyl-1,1'-biphenyl-4,4'-diamine($\alpha$-NPD); phenylenediamine-based compounds such as N,N,N',N'-tetraphenyl-para-phenylenediamine, N,N,N',N'-tetra (para-tolyl)-para-phenylenediamine, and N,N,N',N'-tetra (meta-tolyl)-meta-phenylenediamine(PDA); carbazole-based compounds such as carbazole, N-isopropylcarbazole, and N-phenylcarbazole; stilbene-based compounds such as stilbene, and 4-di-para-tolylaminostilbene; oxazole-based compounds; triphenylmethane-based compounds such as triphenylmethane; pyrazoline-based compounds such as 1-phenyl-3-(para-dimethylaminophenyl)pyrazoline; benzine (cyclohexadiene)-based compounds; triazole-based compounds such as triazole; imidazole-based compounds such as imidazole; oxadiazole-based compounds such as oxadiazole, 1,3,4-oxadiazole, and 2,5-di(4-dimethylaminophenyl)-1,3,4-oxadiazole; anthracene-based compounds such as anthracene, and 9-(4-diethylaminostyryl)anthracene; fluorenone-based compounds such as fluorenone, 2,4,7-trinitro-9-fluorenone, and 2,7-bis(2-hydroxy-3-(2-chlorophenylcarbamoyl)-1-naphthylazo)fluorenone; aniline-based compounds such as polyaniline; silane-based compounds; thiophene-based compounds such as polythiophene, and poly (thiophenevinylene); pyrrole-based compounds such as poly (2,2'-thienylpyrrole), and 1,4-dithioketo-3,6-diphenyl-pyrrolo-(3,4-c)pyrrolopyrrole; porphyrin-based compounds such as porphyrin, and metal tetraphenylporphyrin; quinacridon-based compounds such as quinacridon; metallic or non-metallic phthalocyanine-based compounds such as phthalocyanine, copper phthalocyanine, tetra(t-butyl)copper phthalocyanine, and iron phthalocyanine; metallic or non-metallic naphthalocyanine-based compounds such as copper naphthalocyanine, vanadyl naphthalocyanine, and monochloro gallium naphthalocyanine; and benzidine-based compounds such as N,N'-di(naphthalene-1-yl)-N,N'-diphenyl-benzidine and N,N,N',N'-tetraphenylbenzidine. These compounds can be used singly or in combination of two or more.

These compounds can be used as a monomer or an oligomer (which is a low-molecular hole transport material), or as a prepolymer or a polymer containing these compounds in a main chain or a side chain thereof (which is a high-molecular hole transport material).

In addition to the above materials, poly(3,4-ethylenedioxythiophene/styrenesulfonic acid) (PEDOT/PSS) and the like can also be used for a hole transport material, for example.

Further, the above mentioned compounds that can be used as a hole transport material may be used singly or in combination of two or more of them.

The thickness of the hole transport layer 41 is not limited to any specific value, but is preferably in the range of about 10 to 150 nm, more preferably in the range of about 50 to 100 nm. If the thickness of the hole transport layer 41 is too thin, there is a fear that a pin hole is produced, causing a short-circuit. On the other hand, if the thickness of the hole transport layer 41 is too thick, there is a fear that the hole transport layer 41 is colored so that the chromaticity (hue) of luminescent color of the organic EL device 1 is changed.

The electron transport layer 43 has the function of transporting electrons, which are injected from the cathode 5, to the light emitting layer 42.

Examples of a constituent material of the electron transport layer 43 (an electron transport material) include: benzene-based compounds (starburst-based compounds) such as 1,3,5-tris[(3-phenyl-6-tri-fluoromethyl)quinoxaline-2-yl] benzene (TPQ1), and 1,3,5-tris[{3-(4-t-butylphenyl)-6-trisfluoromethyl}quinoxaline-2-yl]benzene (TPQ2); naphthalene-based compounds such as naphthalene; phenanthrene-based compounds such as phenanthrene; chrysene-based compounds such as chrysene; perylene-based compounds such as perylene; anthracene-based compounds such as anthracene; pyrene-based compounds such as pyrene; acridine-based compounds such as acridine; stilbene-based compounds such as stilbene; thiophene-based compounds; butadiene-based compounds such as butadiene; coumarin-based compounds such as coumarin; quinoline-based compounds such as quinoline; bistyryl-based compounds such as bistyryl; pyrazine-based compounds such as pyrazine and distyrylpyrazine; quinoxaline-based compounds such as quinoxaline; benzoquinone-based compounds such as benzoquinone, and 2,5-diphenyl-para-benzoquinone; naphthoquinone-based compounds such as naphthoquinone; anthraquinone-based compounds such as anthraquinone; oxadiazole-based compounds such as oxadiazole, 2-(4-biphenylyl)-5-(4-t-butylphenyl)-1,3,4-oxadiazole (PBD); triazole-based compounds such as triazole, and 3,4,5-triphenyl-1,2,4-triazole; oxazole-based compounds; anthrone-based compounds such as anthrone; fluorenone-based compounds such as fluorenone, and 1,3,8-trinitro-fluorenone (TNF); diphenoquinone-based compounds such as diphenoquinone, and MBDQ; stilbenequinone-based compounds such as stilbenequinone, and MBSQ; anthraquinodimethane-based compounds; thiopyran dioxide-based compounds; fluorenylidenemethane-based compounds; diphenyldicyanoethylene-based compounds; metallic or non-metallic phthalocyanine-based compounds such as phthalocyanine, copper phthalocyanine, and iron phthalocyanine; and various metal complexes such as 8-hydroxyquinoline aluminum (Alq$_3$), and complexes having benzooxazole or benzothiazole as a ligand.

Further, the above mentioned compounds that can be used as an electron transport material may be used singly or in combination of two or more of them.

The thickness of the electron transport layer 43 is not limited to any specific value, but is preferably in the range of about 1 to 100 nm, more preferably in the range of about 20 to 50 nm. If the thickness of the electron transport layer 43 is too thin, there is a fear that a pin hole is produced, causing a short-circuit. On the other hand, if the electron transport layer 43 is too thick, there is a fear that the value of resistance becomes high.

When a current flows between the anode 3 and the cathode 5 (that is, a voltage is applied across the anode 3 and the cathode 5), holes are moved in the hole transport layer 41 and electrons are moved in the electron transport layer 43, and the holes and the electrons are then recombined in the light emitting layer 42. Then, in the light emitting layer 42, excitons are produced by energy released upon the recombination, and the excitons release energy (in the form of fluorescence or phosphorescence) or emit light when returning to the ground state.

Any material can be used as a constituent material of the light emitting layer 42 (a light emitting material) so long as it can provide a field where holes can be injected from the anode 3 and electrons can be injected from the cathode 5 during the application of a voltage to allow the holes and the electrons to be recombined.

Further, it is preferred that the light emitting material is in either of the solid form or semi-solid form at room temperature. Such a light emitting material makes it possible to prevent or suppress the alteration and deterioration of the organic EL device 1 with the lapse of time, and as a result thereof, it is possible to improve the effect of suppressing the decrease of light-emission luminance in an organic EL device.

Further, it is preferred for the light emitting material that in a case where a thin film having a thickness of 50 nm is formed on a transparent electrode as the light emitting layer and a metallic electrode is provided on the thin film, luminescence higher than 10 cd/m$^2$ is obtained by applying a voltage of 6V. When an organic EL element 1 constituted from such a light emitting material is applied to a display, for example, it is possible to obtain an image having high visibility.

As light emitting materials which can satisfy the above conditions, there are known various low-molecular light emitting materials and various high-molecular light emitting materials as mentioned below. In the present invention, these materials can be used singly or in combination of two or more of them.

In this regard, it is to be noted that the use of such a low-molecular light emitting material makes it possible to obtain a dense light emitting layer 42, thereby improving the light emitting efficiency of the light emitting layer 42. Further, since such a high-molecular light emitting material is relatively easily dissolve in a solvent, it is possible to form the light emitting layer 42 easily by means of various application methods such as an ink-jet printing method and the like. Furthermore, if the low-molecular light emitting material and the high-molecular light emitting material are used together, it is possible to obtain a synergistic effect that a dense light emitting layer 42 having an excellent light emitting efficiency can be easily formed by means of various application methods such as an ink-jet printing method and the like.

Examples of such a low-molecular light emitting material include: benzene-based compounds such as distyrylbenzene (DSB), and diaminodistyrylbenzene (DADSB); naphthalene-based compounds such as naphthalene and Nile red; phenanthrene-based compounds such as phenanthrene; chrysene-based compounds such as chrysene and 6-nitrochrysene; perylene-based compounds such as perylene, and N,N'-bis(2,5-di-t-butylphenyl)-3,4,9,10-perylene-di-carboxy imide (BPPC); coronene-based compounds such as coronene; anthracene-based compounds such as anthracene, and bis-styrylanthracene; pyrene-based compounds such as pyrene; pyran-based compounds such as 4-(di-cyanomethylene)-2-methyl-6-(para-dimethylaminostyryl)-4H-pyran (DCM); acridine-based compounds such as acridine; stilbene-based compounds such as stilbene; thiophene-based compounds such as 2,5-dibenzooxazolethiophene; benzooxazole-based compounds such as benzooxazole; benzoimidazole-based compounds such as benzoimidazole; benzothiazole-based compounds such as 2,2'-(para-phenylenedivinylene)-bisbenzothiazole; butadiene-based compounds such as bistyryl(1,4-diphenyl-1,3-butadiene), and tetraphenylbutadiene; naphthalimide-based compounds such as naphthalimide; coumarin-based compounds such as coumarin; perynone-based compounds such as perynone; oxadiazole-based compounds such as oxadiazole; aldazine-based compounds; cyclopentadiene-based compounds such as 1,2,3,4,5-pentaphenyl-1,3-cyclopentadiene (PPCP); quinacridone-based compounds such as quinacridone and quinacridone red; pyridine-based compounds such as pyrrolopyridine, and thiadiazolopyridine; spiro compounds such as 2,2',7,7'-tetraphenyl-9,9'-spirobifluorene; metallic or non-metallic phthalocyanine-based compounds such as phthalocyanine (H$_2$Pc), and copper phthalocyanine; florene-based compounds such as florene; and various metallic complexes such as 8-hydroxyquinoline aluminum (Alq$_3$), tris(4-methyl-8-quinolinolate) aluminum(III) (Almq$_3$), tris (4-methyl-8-hydroxyquinoline) aluminum, and tris (5-choloro-8-hydroxyquinolinate) aluminum, 8-hydroxyquinoline zinc (Znq$_2$), (1,10-phenanthroline)-tris-(4,4,4-trifluoro-1-(2-thienyl)-butane-1,3-dionate) europium(III) (Eu(TTA)$_3$(phen)), fac-tris (2-phenylpyridine) iridium (Ir(ppy)$_3$), and 2,3,7,8,12,13,17,18-octaethyl-21H, 23H-porphin platinum(II). These materials can be used singly or in combination of two or more of them.

Examples of a high-molecular light emitting material include polyacetylene-based compounds such as trans-type polyacetylene, cis-type polyacetylene, poly(di-phenylacetylene) (PDPA), and poly(alkyl, phenylacetylene) (PAPA); polyparaphenylenevinylene-based compounds such as poly (para-phenylenevinylene) (PPV), poly(2,5-dialkoxy-para-phenylenevinylene) (RO-PPV), cyano-substituted-poly (para-phenylenevinylene) (CN-PPV), poly(2-dimethyloctylsilyl-para-phenylenevinylene) (DMOS-PPV), and poly(2-methoxy-5-(2'-ethylhexoxy)-para-phenylenevinylene)_(MEH-PPV); polythiophene-based compounds such as poly(3-alkylthiophene) (PAT), and poly(oxypropylene)triol (POPT); polyfluorene-based compounds such as poly (9,9-dialkylfluorene) (PDAF), poly(9,9'-dihexyl-2,7-(2-cyanovinylene)fluorenylene, poly[9,9'-dioctyl-2,7-divinylenefluorenylene]-alt-co(biphenyl-4,4'-diyl); polyparaphenylene-based compounds such as poly(para-phenylene) (PPP), and poly(1,5-dialkoxy-para-phenylene) (RO-PPP); polycarbazole-based compounds such as poly(N-vinylcarbazole) (PVK); and polysilane-based compounds such as poly(methylphenylsilane) (PMPS), poly(naphthylphenylsilane) (PNPS), and poly(biphenylylphenylsilane) (PBPS). These compounds can be used singly or in combination of two or more of them. Further, when these compounds are used in combination of two or more of them, it is preferred that they are used as copolymer. Of course, these two or more kinds of compounds may be used as a blended body or polymer alloy or the like. Since these types of compounds are soluble to solvents, they are particularly suitable for use with various application methods such as an ink-jet printing and the like.

The thickness of the light emitting layer 42 is not limited to any specific value, but is preferably in the range of about 10 to 150 nm, more preferably in the range of about 50 to 100 nm. By setting the thickness of the light emitting layer to a value within the above range, recombination of holes and electrons efficiently occurs, thereby enabling the light emitting efficiency of the light emitting layer 42 to be further improved.

Further, the light emitting material of the present invention is particularly useful when such a relatively think light emitting layer 42 is formed.

Although, in the present embodiment, each of the light emitting layer 42, the hole transport layer 41 and the electron transport layer 43 is separately provided, they may be formed into a hole-transportable light emitting layer which combines the hole transport layer 41 with the light emitting layer 42 or an electron-transportable light emitting layer which combines the electron transport layer 43 with the light emitting layer 42. In this case, an area in the vicinity of the interface between the hole-transportable light emitting layer and the electron transport layer 43 or an area in the vicinity of the interface between the electron-transportable light emitting layer and the hole transport layer 41 functions as the light emitting layer 42. In this modification, as for constituent materials for the hole-transportable light emitting layer and electron-transportable light emitting layer, light emitting materials having the function of transporting electrons and holes (that is, carriers) can be used by appropriately selecting such materials from the light emitting materials of the present invention mentioned above.

As described above, the light emitting material of the present invention includes not only materials that merely contribute to luminescence but also materials that possess additional functions such as carrier injection function and carrier transport function.

Further, in a case where the hole-transportable light emitting layer is used, holes injected from an anode into the hole-transportable light emitting layer are trapped by the electron transport layer, and in a case where the electron-transportable light emitting layer is used, electrons injected from a cathode into the electron-transportable light emitting layer are trapped in the electron-transportable light emitting layer. In both cases, there is an advantage that the recombination efficiency of holes and electrons can be improved.

Furthermore, between the adjacent layers in the layers 3, 4 and 5, any additional layer may be provided according to its purpose. For example, a hole injecting layer made of copper phthalocyanine or the like may be provided between the hole transport layer 41 and the anode 3, or an electron injecting layer made of LiF or the like may be provided between the electron transport layer 43 and the cathode 5.

The protection layer 6 is provided so as to cover the layers 3, 4 and 5 constituting the organic EL device 1. This protection layer 6 has the function of hermetically sealing the layers 3, 4 and 5 constituting the organic EL device 1 to shut off oxygen and moisture. By providing such a protection layer 6, it is possible to obtain the effect of improving the reliability of the organic EL device 1 and the effect of preventing the alteration and deterioration of the organic EL device 1.

Examples of a constituent material of the protection layer 6 include Al, Au, Cr, Nb, Ta and Ti, alloys containing them, silicon oxide, various resin materials, and the like. In this regard, it is to be noted that in a case where a conductive material is used as a constituent material of the protection layer 6, it is preferred that an insulating film is provided between the protection layer 6 and each of the layers 3, 4 and 5 to prevent a short circuit therebetween, if necessary.

This organic EL device 1 can be used for a display, for example, but it can also be used for various optical purposes such as a light source and the like.

In a case where the organic EL device 1 is applied to a display, the drive system thereof is not particularly limited, and either of an active matrix system or a passive matrix system may be employed.

The organic EL device 1 as described above can be manufactured in the following manner, for example.

<1> First, the Substrate 2 is Prepared, and the Anode 3 is then Formed on the Substrate 2.

The anode 3 can be formed by, for example, chemical vapor deposition (CVD) such as plasma CVD, thermal CVD, or laser CVD, dry plating such as vacuum deposition, sputtering, or ion plating, wet plating such as electrolytic plating, immersion plating, or electroless plating, sputtering, a sol-gel method, a MOD method, bonding of a metallic foil, or the like.

<2> Next, the Hole Transport Layer 41 is Formed on the Anode 3.

The hole transport layer 41 can be formed by, for example, applying a hole transport layer material, obtained by dissolving the hole transport material as mentioned above in a solvent, on the anode 3.

In the application of the hole transport layer material, various application methods such as a spin coating method, a casting method, a micro gravure coating method, a gravure coating method, a bar coating method, a roll coating method, a wire-bar coating method, a dip coating method, a spray coating method, a screen printing method, a flexographic printing method, an offset printing method, an ink-jet printing method, and the like can be employed. According to such an application method, it is possible to relatively easily form the hole transport layer 41.

Examples of a solvent in which the hole transport material is to be dissolved include: inorganic solvents such as nitric acid, sulfuric acid, ammonia, hydrogen peroxide, water, carbon disulfide, carbon tetrachloride, and ethylene carbonate; and various organic solvents such as ketone-based solvents e.g., methyl ethyl ketone (MEK), acetone, diethyl ketone, methyl isobutyl ketone (MIBK), methyl isopropyl ketone (MIPK), and cyclohexanone, alcohol-based solvents e.g., methanol, ethanol, isopropanol, ethylene glycol, diethylene glycol (DEG), and glycerol, ether-based solvents e.g., diethyl ether, diisopropyl ether, 1,2-dimethoxy ethane (DME), 1,4-dioxane, tetrahydrofuran (THF), tetrahydropyran (THP), anisole, diethylene glycol dimethyl ether (diglyme), and diethylene glycol ethyl ether (Carbitol), cellosolve-based solvents e.g., methyl cellosolve, ethyl cellosolve, and phenyl cellosolve, aliphatic hydrocarbon-based solvents e.g, hexane, pentane, heptane, and cyclohexane, aromatic hydrocarbon-based solvents e.g., toluene, xylene, and benzene, aromatic heterocyclic compound-based solvents e.g., pyridine, pyrazine, furan, pyrrole, thiophene, and methyl pyrrolidone, amide-based solvents e.g., N,N-dimethylformamide (DMF), and N,N-dimethylacetamide (DMA), halogen compound-based solvents e.g., dichloromethane, chloroform, and 1,2-dichloroethane, ester-based solvents e.g., ethyl acetate, methyl acetate and ethyl formate, sulfur compound-based solvents e.g., dimethyl sulfoxide (DMSO) and sulfolane, nitrile-based solvents e.g., acetonitrile, propionitrile, and acrylonitrile, organic acid-based solvents e.g., formic acid, acetic acid, trichloroacetic acid, and trifluoroacetic acid, and mixed solvents containing them.

If necessary, an obtained coating may be subjected to heat treatment, for example, in the atmosphere or an inert atmosphere or under a reduced pressure (or a vacuum). This makes it possible to dry the coating (removal of a solvent or a dispersion medium) or polymerize the hole transport material, for example. In this regard, it is to be noted that the coating may be dried without heat treatment.

Further, in a case where a low-molecular hole transport material is used, a binder (high-molecular binder) may be added to the hole transport layer material, if necessary.

As a binder, one which does not extremely inhibit charge transport and has a low absorptivity for visible radiation is preferably used. Specifically, examples of such a binder include polyethylene oxide, polyvinylidene fluoride, polycarbonate, polyacrylate, polymethyl acrylate, polymethyl methacrylate, polystyrene, polyvinyl chloride, polysiloxane, and the like, and they can be used singly or in combination of two or more of them. Alternatively, the high-molecular hole transport material as mentioned above may be used for the binder.

It is to be noted that in a case where a low-molecular hole transport material is used, the hole transport layer 41 may also be formed by, for example, vacuum deposition or the like.

<3> Next, the Light Emitting Layer 42 is Formed on the Hole Transport Layer 41.

The light emitting layer 42 can be formed in the same manner as the hole transport layer 41. Namely, the light emitting layer 42 can be formed using the light emitting material mentioned above in a manner as described above with reference to the hole transport layer 41.

Specifically, the light emitting layer 42 can be formed by applying a light emitting layer material (that is, a material for forming a light emitting layer) which is obtained by dissolving a light emitting material in a solvent onto the hole transport layer 41 and then drying it.

<4> Next, the Electron Transport Layer 43 is Formed on the Light Emitting Layer 42.

The electron transport layer 43 can be formed in the same manner as the hole transport layer 41. Namely, the electron transport layer 43 can be formed using the electron transport material mentioned above in a manner as described above with reference to the hole transport layer 41.

<5> Next, the Cathode 5 is Formed on the Electron Transport Layer 43.

The cathode 5 can be formed by, for example, vacuum deposition, sputtering, bonding of a metallic foil, or the like.

<6> Next, the Protection Layer 6 is Formed so as to Cover the Anode 3, the Organic EL Layer 4 and the Cathode 5.

The protection layer 6 can be formed (provided) by, for example, bonding a box-like protection cover constituted of the material as mentioned above by the use of various curable resins (adhesives).

As for the curable resins, all of thermosetting resins, photocurable resins, reactive curable resins, and anaerobic curable resins can be used.

The organic EL device 1 is manufactured through these processes as described above.

Next, the light emitting material and the method of manufacturing the light emitting material according to the present invention will be described.

<Light Emitting Material>

The light emitting material of the present invention is used for the light emitting layer 42 in the organic EL device 1 as described above.

In order to suppress the decrease of light-emission luminance of the organic EL device 1, the present inventors have been made extensive researches and studies for constituent materials of all the layers constituting the organic EL device 1, and in particular they have paid their attentions to a light emitting material among the constituent materials. As a result, the present inventors have found that the decrease of light-emission luminance of the organic EL device 1 can be effectively suppressed by controlling the amount of impurities contained in the light emitting material, especially the amount of metallic impurities, to within a predetermined amount, leading to the completion of the present invention.

Specifically, the present invention is required to satisfy at least one of the following conditions (A) and (B).

(A) When the light emitting layer 42 is formed using the light emitting material of the present invention, the amount of a metallic impurity of which content is the largest among metallic impurities contained in the light emitting layer 42 should be 2.5 ppm or less (preferably 1.0 ppm or less).

(B) When the light emitting layer material of the present invention is dissolved in a liquid so that the concentration thereof becomes 2.0 wt %, the amount of a metallic impurity of which content is the largest among metallic impurities contained in the liquid is 500 ppb or less (preferably, 400 ppb or less).

By satisfying at least one of these conditions, it is possible to suppress the decrease of light-emission luminance of the organic EL device 1. As a result, it becomes possible to provide an organic EL device 1 that can maintain excellent light emitting properties for a long period of time. It is supposed that the reason why such an effect can be obtained is resulted from the fact that sub-reaction caused by impurities can be suppressed, which is considered to be one of large factors for such an effect.

Further, when the light emitting material contains two or more kinds of metallic impurities, it is preferred that the total amount of the metallic impurities contained in the light emitting layer 42 is 10 ppm or less, and more preferably 5 ppm or less. Furthermore, it is preferred that the total amount of the metallic impurities contained in the 2.0 wt % solution is 200 ppb or less, and more preferably 100 ppb or less.

By controlling the total amount of the metallic impurities contained in the light emitting layer 42 and the 2.0 wt % solution to within the range mentioned above, it is possible to suppress the decrease of light-emission luminance of the organic EL device 1 more reliably.

In this case, it is preferred that the metallic impurities to be eliminated include metal elements and metal ions. By eliminating such metallic impurities, it becomes possible to provide a light emitting material that can suppress the decrease of light-emission luminance of the organic EL device 1 even more reliably.

Examples of metals which constitute such metallic impurities include main group metal elements such as Li, Na, K, Rb, Sc, Fr, Be, Mg, Ca, Sr, Ba, Ra, Al, Ga, In, Ti, and Pb, and transit metal elements such as Sc, Y, Ti, Zr, Hf, V, Nb, Ta, Cr, Mo, W, Mn, Tc, Re, Fe, Co, Ni, Ru, Rh, Pd, Os, Ir, Pt, Cu, Ag, Au, Zn, Cd and Hg. Among these elements, Mg, Ca, Al, and Na are particularly preferred. By eliminating metallic impurities of these metals, the effect of the decrease of light-emission luminance of the organic EL device 1 is especially conspicuously exhibited.

<Method of Refining Light Emitting Material>

As for a method of eliminating metallic impurities from the light emitting material (elimination method), the following methods can be employed for a low-molecular hole transport material and a high-molecular hole transport material, respectively, for example.

Specifically, in the case of a low-molecular light emitting material, examples of such an elimination method include an electrolytic separation method, a neutralization method, a sublimation refining method, a recrystallization method, a reprecipitation method, and a method using elimination means capable of separating or eliminating metallic impurities. These methods can be used singly or in combination of two or more of them.

Here, examples of the elimination means include a filter, a column filler, a permeable membrane (dialyzer), and a medium with a density gradient. Specifically, examples of the elimination method using the elimination means include: a filtration method; various chromatography methods such as an adsorption chromatography method, an ion exchange chromatography method, a partition (normal phase or reverse phase) chromatography method, a molecular sieve chromatography method (gel filtration), a countercurrent distribution chromatography method, and a droplet countercurrent distribution chromatography method; a centrifugal separation method such as density gradient centrifugation; an ultrafiltration method; and a dialysis method.

On the other hand, in the case of a high-molecular light emitting material, an elimination method using elimination means, such as a filtration method, an ultrafiltration method, or a dialysis method is suitably employed.

Among these methods, as a method for eliminating metallic impurities, an elimination method using elimination means (that is, a method of refining a light emitting material which is employed in the present invention) is preferably employed, and in particular, a filtration method is preferably employed. According to such a method, it is possible to relatively and easily eliminate metallic impurities from the light emitting material in a short period of time. Further, by only selecting the kind of filter (elimination means) to be used appropriately, target metallic impurities can be efficiently and reliably eliminated.

Hereinafter, a detailed description will be made with regard to the method for eliminating metallic impurities based on the typical case where the filtration method is employed.

According to the filtration method, a solution for refinement obtained by dissolving a light emitting material in a solvent is passed through a filter to separate and eliminate metallic impurities from the solution for refinement by the filter, and the solvent is then removed, to thereby refine the light emitting material. By doing so, the amount of the metallic impurities contained in the light emitting is adjusted so as to lie within a target range (preferably, within the above-described range). According to this method, it is possible to easily adjust the amount of metallic impurities contained in the light emitting material to within the above-described range.

When the solution for refinement is prepared, the same solvents that have been mentioned with reference to the method for manufacturing the organic EL device 1 (process of forming the hole transport layer 41) can be used.

As for a filter to be used in the filtration method, various filters can be used, and in particular, a filter formed using a cation-exchange resin as its main component is suitably used. By using such a filter, it is possible to efficiently eliminate target metallic impurities from the light emitting material.

Examples of such a cation-exchange resin include strongly acidic cation-exchange resins, weakly acidic cation-exchange resins, and chelating resins capable of selectively eliminating heavy metals. For example, those obtained by introducing various functional groups such as —$SO_3M$, —COOM, and —$N=(CH_2COO)_2M$ into main chains of various polymers such as styrene-based polymers, methacrylic polymers and acrylic polymers can be used. In this regard, it is to be noted that the functional group is appropriately selected depending on the kind of cation-exchange resin, and the like.

The rate at the time when the solution for refinement is passed through a filter (hereinafter, referred to as "liquid passage rate") is not limited to any specific value, but is preferably in the range of about 1 to 1,000 mL/min, more preferably in the range of about 50 to 100 mL/min. By setting the liquid passage rate of the solution for refinement to a value within the above range, it is possible to more efficiently carry out the elimination of metallic impurities.

Further, the temperature of the solution for refinement (hereinafter, referred to as "solution temperature") is also not limited to any specific value, but it is preferred that the temperature is as high as possible within the range that does not interfere with the operation for eliminating metallic impurities. Namely, the solution temperature is preferably in the range of about 0 to 80° C., more preferably in the range of about 10 to 25° C. By setting the solution temperature to a value within the above range, it is possible to more efficiently carry out the elimination of metallic impurities.

In this case, the solution for refinement may be passed through a filter not only once but also two or more times, or it may also be passed through different kinds of two or more filters. Further, these filtering operations may be carried out in combination. By doing so, it is possible to more efficiently eliminate metallic impurities.

In this regard, it is to be noted that the solution for refinement after the refining process may be used for manufacturing the organic EL device 1 as it is without removing the solvent.

Although the hole transport material and the method of manufacturing the hole transport material according to the present invention have been described, it should be understood that the present invention are not limited thereto.

EXAMPLES

Next, actual examples of the present invention will be described.

<Refinement of Hole Transport Material>

Example 1

As a light emitting material, poly[9,9'-dihexyl-2,7-(2-cyanovinylene) fluorenylene] (having a weight-average molecular weight of 120,000) was prepared.

Next, this light emitting material was dissolved in a toluene so that the concentration thereof became 2.0 wt % to prepare a light emitting material solution for refinement.

Next, this solution was passed through a column provided with six filters at a solution temperature of 20° C. and at a liquid passage rate of 50 mL/min, to eliminate metallic impurities.

In this regard, it is to be noted that all of the filters were made of a styrene-based sulfonic acid-type strongly acidic cation-exchange resin.

Example 2

Refinement of a light emitting material was carried out in the same manner as in Example 1 except that all of the six filters were replaced with filters made of a methacrylic-based carboxylic acid-type weekly acidic anion-exchange resin.

Example 3

Refinement of a light emitting material was carried out in the same manner as in Example 1 except that all of the six filters were replaced with filters made of an acrylic-based carboxylic acid-type weekly acidic anion-exchange resin.

Example 4

Refinement of a light emitting material was carried out in the same manner as in Example 1 except that the six filters were replaced with three filters that were the same as those of Example 1 and three filters that were the same as those of Example 2.

Example 5

Refinement of a light emitting material was carried out in the same manner as in Example 1 except that the six filters were replaced with three filters that were the same as those of Example 1 and three filters that were the same as those of Example 3.

Example 6

Refinement of a light emitting material was carried out in the same manner as in Example 1 except that the six filters were replaced with three filters that were the same as those of Example 2 and three filters that were the same as those of Example 3.

Example 7

Refinement of a light emitting material was carried out in the same manner as in Example 1 except that the six filters were replaced with two filters that were the same as those of Example 1, two filters that were the same as those of Example 2, and two filters that were the same as those of Example 3.

Example 8

Refinement of a light emitting material was carried out in the same manner as in Example 1 except that the six filters were replaced with two filters that were the same as those of Example 1, two filters that were the same as those of Example 2, and two filters made of a styrene-based iminodiacetic acid-type chelating resin.

Example 9

Refinement of a light emitting material was carried out in the same manner as in Example 1 except that the six filters were replaced with two filters that were the same as those of Example 1, two filters that were the same as those of Example 3, and two filters made of a styrene-based iminodiacetic acid-type chelating resin.

Example 10

Refinement of a light emitting material was carried out in the same manner as in Example 1 except that the six filters were replaced with two filters that were the same as those of Example 2, two filters that were the same as those of Example 3, and two filters made of a styrene-based iminodiacetic acid-type chelating resin.

Examples 11 to 20

Refinements of light emitting materials were carried out in the same manner as in Examples 1 to 10, respectively, except that a light emitting material obtained by mixing the same light emitting material as that of Example 1 with poly(9,9'-dioctyl-2,7-divinylenefluorenylene-alt-co(biphenyl-4,4'-diyl) (having a weight average molecular weight of 20,000) in a ratio of 50:50 (weight ratio) was used as a hole transport material in each of Examples 11 to 20.

Examples 21 to 30

Refinements of light emitting materials were carried out in the same manner as in Examples 1 to 10, respectively, except that a light emitting material obtained by mixing the same light emitting material as that of Example 1 with tris(4-methyl-8-hydroxyquinoline) aluminum in a ratio of 90:10 (weight ratio) was used as a hole transport material in each of Examples 21 to 30.

Examples 31 to 40

Refinements of light emitting materials were carried out in the same manner as in Examples 1 to 10, respectively, except that a light emitting material obtained by mixing the same light emitting material as that of Example 1 with tris (4-methyl-8-hydroxyquinoline) aluminum, and tris (5-choloro-8-hydroxy-quinolinate) aluminum in a ratio of 85:10:5 (weight ratio) was used as a hole transport material in each of Examples 31 to 40.

Comparative Example 1

Although the same light emitting material as that of Example 1 was prepared, its refinement was omitted.

Comparative Example 2

Although the same light emitting material as that of Example 11 was prepared, its refinement was omitted.

Comparative Example 3

Although the same light emitting material as that of Example 21 was prepared, its refinement was omitted.

Comparative Example 4

Although the same light emitting material as that of Example 31 was prepared, its refinement was omitted.

<Evaluation>

1. Measurement of Amount of Metallic Impurities

The amount of the metallic impurities contained in the refined light emitting material solution obtained in each of Examples 1 to 40, and the amount of the metallic impurities contained in the unrefined light emitting material solution of each of Comparative Examples 1 to 4 were measured using an Inductively coupled plasma mass spectroscopy method (ICP-MS method), respectively.

Specifically, 0.5 g of the light emitting material solution was weighed in a quartz crucible, and an ashing treatment was successively carried out with a hot plate and an electric furnace. Next, the ashed matter was subjected to thermolysis using nitric acid, and was then made up to a constant volume with dilute nitric acid. The obtained solution with a constant volume was analyzed by an ICP-MS method.

The analytical results were evaluated according to the following eight criteria depending on the amount of the metallic impurities.

+: more than 1 ppb but 10 ppb or less
2+: more than 10 ppb but 20 ppb or less
3+: more than 20 ppb but 30 ppb or less
4+: more than 30 ppb but 40 ppb or less
5+: more than 40 ppb but 50 ppb or less
6+: more than 50 ppb but 100 ppb or less
7+: more than 100 ppb but 200 ppb or less
8+: more than 200 ppb 2. Evaluation of Decrease of Light-Emission Luminance of Organic EL Device Organic EL devices were manufactured in the following manner using the refined light emitting materials obtained in Examples 1 to 40 and the unrefined light emitting materials of Comparative Examples 1 to 4, respectively.

First, a transparent glass substrate having an average thickness of 0.5 mm was prepared.

Next, an ITO electrode (anode) having an average thickness of 100 nm was formed on the substrate by a vacuum deposition method.

Next, a 2.0 wt % aqueous solution of a polythiophene-based compound (which is manufactured by Bayer Corp. under the product name of "Baytron P") was applied on the ITO electrode by a spin coating method and was then dried, to form a hole transport layer having an average thickness of 50 nm.

Next, the light emitting material solution was applied onto the hole transport layer by a spin coating method and was then dried, to form a light emitting layer having an average thickness of 50 nm.

Next, an electron transport layer having an average thickness of 20 nm was formed on the light emitting layer by vacuum deposition of 3,4,5-triphenyl-1,2,4-triazole.

Next, an AlLi electrode (cathode) having an average thickness of 300 nm was formed on the electron transport layer by a vacuum deposition method.

Next, a protection cover made of polycarbonate was coated so as to cover the formed layers, and was fixed and sealed with an ultraviolet rays-curable resin, to complete the organic EL device.

A voltage of 6V was applied across the ITO electrode and the AlLi electrode of each of the organic EL devices manufactured in such a manner described above, and light-emission luminance was measured to determine the time elapsed before the initial value of light-emission luminance was decreased to half (a half-life).

The measurement results of the amounts of the metallic impurities and the evaluation results of the decrease of light-emission luminance of each of the organic EL devices are shown in the following Tables 1 to 4.

It is to be noted that each of Tables 1 to 4 shows the amounts of each of the metallic impurities of Na, Mg, Al and Ca, and the total amounts of the metallic impurities.

In this connection, it is to be noted that no metallic impurities were detected by the ICP-MS method in the toluene which was used for preparing the light emitting material solution. Therefore, it is supposed that the obtained results were derived from the metallic impurities contained in the light emitting materials.

Moreover, the evaluation result of decrease of light-emission luminance of each organic EL device was shown by the relative value of half-life of light-emission luminance of the organic EL device manufactured using the light emitting material of each of Examples and Comparative Examples. In this regard, it is to be noted that each value was determined by defining the half-life of light-emission luminance of the organic EL device manufactured using the non-refined light emitting material of each of the corresponding Comparative Examples as "1".

TABLE 1

| | Amount of metallic impurities | | | | | Evaluation of decrease of light-emission luminance Half-life |
|---|---|---|---|---|---|---|
| | Na | Mg | Al | Ca | Total | (Relative value) |
| Ex. 1 | 4+ | + | + | 2+ | 6+ | 1.4 |
| Ex. 2 | 4+ | + | + | 2+ | 6+ | 1.4 |
| Ex. 3 | 5+ | + | + | 3+ | 6+ | 1.3 |
| Ex. 4 | 5+ | + | + | 2+ | 6+ | 1.4 |
| Ex. 5 | 5+ | + | + | 3+ | 6+ | 1.5 |
| Ex. 6 | 5+ | + | + | 3+ | 6+ | 1.3 |
| Ex. 7 | 5+ | + | + | 3+ | 6+ | 1.3 |
| Ex. 8 | 4+ | + | + | 3+ | 6+ | 1.4 |
| Ex. 9 | 5+ | + | + | 3+ | 6+ | 1.2 |
| Ex. 10 | 4+ | + | + | 3+ | 6+ | 1.3 |
| Com. Ex. 1 | 7+ | + | 3+ | 6+ | 8+ | 1 |

TABLE 2

| | Amount of metallic impurities | | | | | Evaluation of decrease of light-emission luminance Half-life |
|---|---|---|---|---|---|---|
| | Na | Mg | Al | Ca | Total | (Relative value) |
| Ex. 11 | 5+ | + | + | 3+ | 6+ | 1.3 |
| Ex. 12 | 4+ | + | 2+ | 2+ | 6+ | 1.4 |
| Ex. 13 | 4+ | + | + | 2+ | 6+ | 1.4 |
| Ex. 14 | 5+ | + | 2+ | 2+ | 6+ | 1.3 |
| Ex. 15 | 5+ | + | 2+ | 4+ | 7+ | 1.2 |
| Ex. 16 | 4+ | + | + | 2+ | 6+ | 1.4 |
| Ex. 17 | 5+ | + | + | 3+ | 6+ | 1.3 |
| Ex. 18 | 5+ | + | + | 2+ | 6+ | 1.2 |
| Ex. 19 | 5+ | + | + | 4+ | 7+ | 1.2 |
| Ex. 20 | 5+ | + | + | 3+ | 6+ | 1.4 |
| Com. Ex. 2 | 7+ | + | 4+ | 6+ | 8+ | 1 |

TABLE 3

| | Amount of metallic impurities | | | | | Evaluation of decrease of light-emission luminance Half-life |
|---|---|---|---|---|---|---|
| | Na | Mg | Al | Ca | Total | (Relative value) |
| Ex. 21 | 5+ | + | 2+ | 3+ | 6+ | 1.2 |
| Ex. 22 | 4+ | + | + | 2+ | 6+ | 1.3 |
| Ex. 23 | 4+ | + | + | 2+ | 6+ | 1.3 |
| Ex. 24 | 5+ | + | 2+ | 4+ | 6+ | 1.2 |
| Ex. 25 | 4+ | + | + | 2+ | 6+ | 1.2 |
| Ex. 26 | 4+ | + | 2+ | 2+ | 6+ | 1.3 |
| Ex. 27 | 5+ | + | 2+ | 3+ | 7+ | 1.2 |
| Ex. 28 | 5+ | + | + | 4+ | 7+ | 1.3 |
| Ex. 29 | 5+ | + | + | 3+ | 7+ | 1.2 |
| Ex. 30 | 5+ | + | + | 4+ | 6+ | 1.3 |
| Com. Ex. 3 | 6+ | + | 4+ | 6+ | 8+ | 1 |

TABLE 4

| | Amount of metallic impurities | | | | | Evaluation of decrease of light-emission luminance Half-life |
|---|---|---|---|---|---|---|
| | Na | Mg | Al | Ca | Total | (Relative value) |
| Ex. 31 | 4+ | + | 2+ | 2+ | 6+ | 1.4 |
| Ex. 32 | 5+ | + | 2+ | 3+ | 6+ | 1.4 |
| Ex. 33 | 4+ | + | 2+ | 4+ | 6+ | 1.3 |
| Ex. 34 | 4+ | + | 2+ | 3+ | 6+ | 1.4 |

TABLE 4-continued

|  | Amount of metallic impurities | | | | | Evaluation of decrease of light-emission luminance Half-life |
|---|---|---|---|---|---|---|
|  | Na | Mg | Al | Ca | Total | (Relative value) |
| Ex. 35 | 5+ | + | + | 4+ | 6+ | 1.3 |
| Ex. 36 | 4+ | + | + | 3+ | 6+ | 1.4 |
| Ex. 37 | 5+ | + | 2+ | 4+ | 6+ | 1.4 |
| Ex. 38 | 5+ | + | + | 5+ | 7+ | 1.2 |
| Ex. 39 | 5+ | + | + | 4+ | 7+ | 1.3 |
| Ex. 40 | 5+ | + | + | 4+ | 7+ | 1.2 |
| Com. Ex. 4 | 6+ | + | 3+ | 6+ | 8+ | 1 |

As shown in Tables 1 to 4, in the case of the refined light emitting material solution of each of Examples, the amount of the metallic impurities was reduced, and the amounts of NA, Mg, Al and Ca contained therein were controlled to 50 ppb or less.

Further, though not shown in Tables 1 to 4, the amounts of metallic impurities other than NA, Mg, Al and Ca contained in the solutions were also 50 ppb or less (in particular, 10 ppb or less).

Furthermore, in the case of the refined light emitting material solution of each of Examples, the total amount of the metallic impurities was controlled to 200 ppb or less.

Moreover, it is seen from the results that in the organic EL device of each of Examples, the amount of each of the metallic impurities was controlled to 2.5 ppm or less and the total amount of the metallic impurities was also controlled to 10 ppm or less when the amounts of the metallic impurities in the emitting layers were obtained by calculating from the amounts of the metallic impurities contained in the light emitting material solution of each Example.

In contrast with this, in the light emitting material solutions of Comparative Examples which were not refined, the amount of the metallic impurity of which content is largest among the impurities contained in the solution exceeded 50 ppb and the total amount of the metallic impurities exceeded 200 ppb (in particular, 300 ppb).

Further, the organic EL device manufactured using the light emitting material of each of Examples had a longer half-life of light-emission luminance as compared with the organic EL device manufactured using the light emitting material of each of Comparative Examples, that is, the decrease of light-emission luminance was suppressed.

Furthermore, each of Tables shows a tendency that the half-life of light-emission luminance of the organic EL device is prolonged as the amount of the metallic impurities is reduced.

As described above, it has been found that an organic EL device using the light emitting material of the present invention, in which the amount of each of the metallic impurities contained therein is controlled to 50 ppb or less in the 2.0 wt % solution and 2.5 ppm or less in the light emitting layer, is excellent one. That is, in such an organic EL device, the decrease of light-emission luminance is suppressed and excellent light emitting properties are maintained for a long period of time.

In this regard, it is to be noted that the organic EL devices formed using the light emitting material solutions of Examples and each Comparative Examples had light-emission luminance of 1000 cd/m$^2$ in their initial values.

Finally, it is to be noted that the present invention is not limited to the embodiments and examples described above, and any additions or changes may be made without departing from the scope of the present invention.

What is claimed is:

1. A light emitting material to be used for a light emitting layer provided in an organic EL device comprising an anode, a cathode including Al, the light emitting layer provided between the anode and the cathode, and an electron transport layer provided between the cathode and the light emitting layer and including Al complex, the light emitting material being characterized in that when the light emitting material is dissolved in a liquid so that the concentration thereof becomes 2.0 wt %, the liquid contains two or more kinds of metallic impurities, the metallic impurities including Al and at least one of Mg, Ca and Na ions thereof, but an amount of the metallic impurity of which content is the largest among the metallic impurities contained in the liquid is 50 ppb or less, and the total amounts of the metallic impurities contained in the liquid is more than 50 ppb but 200 ppb or less.

2. The light emitting material as claimed in claim 1, wherein the amount of the Al and ion thereof contained in the liquid is more than 1 ppb but 20 ppb or less.

3. The light emitting material as claimed in claim 1, wherein the light emitting material is in a solid form or a semi-solid form at room temperature.

4. The light emitting material as claimed in claim 1, wherein the organic EL device includes a transparent electrode, a thin film formed of the light emitting material, the thin film having a thickness of 50 nm and provided on the transparent electrode, and a metallic electrode provided on the thin film, wherein when a voltage of 6V is applied to the organic EL device, luminescence higher than 10 cd/m$^2$ is obtained.

5. The light emitting material as claimed in claim 1, wherein the light emitting material includes a low-molecular light emitting material.

6. The light emitting material as claimed in claim 5, wherein the low-molecular light emitting material is selected from the group comprising benzene-based compounds, naphthalene-based compounds, phenanthrene-based compounds, chrysene-based compounds, perylene-based compounds, coronene-based compounds, anthracene-based compounds, pyrene-based compounds, pyran-based compounds, acridine-based compounds, stilbene-based compounds, thiophene-based compounds, benzooxazole-based compounds, benzoimidazole-based compounds, benzothiazole-based compounds, butadiene-based compounds, naphthalimide-based compounds, coumarin-based compounds, perynone-based compounds, oxadiazole-based compounds, aldazine-based compounds, cyclopentadiene-based compounds, quinacridone-based compounds, pyridine-based compounds, Spiro compounds, metallic or non-metallic phthalocyanine-based compounds, florene-based compounds, and metallic complexes.

7. The light emitting material as claimed in claim 1, wherein the light emitting material includes a high-molecular light emitting material.

8. The light emitting material as claimed in claim 7, wherein the high-molecular light emitting material is selected from the group comprising polyacetylene-based compounds, polyparaphenylenevinylene-based compounds, polythiophene-based compounds, polyfluorene-based compounds, polyparaphenylene-based compounds, and polycarbazole-based compounds; polysilane-based compounds.

9. The light emitting material as claimed in claim 1, wherein the thickness of the light emitting layer is in the range of 10 to 150 nm.

10. The light emitting material as claimed in claim 1, wherein the Al complex is 8-hydroxyquinoline aluminum.

11. A light emitting material to be used for a light emitting layer provided in an organic EL device comprising an anode, a cathode including Al, the light emitting layer provided between the anode and the cathode, and an electron transport layer provided between the cathode and the light emitting layer and including Al complex, the light emitting material being characterized in that when the light emitting layer is formed using the light emitting material, the light emitting layer contains two or more kinds of metallic impurities, the metallic impurities including at least Al, but an amount of a metallic impurity of which content is the largest among the metallic impurities contained in the layer is 2.5 ppm or less.

12. The light emitting material as claimed in claim 11, wherein the Al complex is 8-hydroxyquinoline aluminum.

13. A light emitting material to be used for a light emitting layer provided in an organic EL device comprising an anode, a cathode including Al, the light emitting layer provided between the anode and the cathode, and an electron transport layer provided between the cathode and the light emitting layer and including Al complex, the light emitting material being characterized in that when the light emitting material is dissolved in a liquid so that the concentration thereof becomes 2.0 wt %, the liquid contains two or more kinds of metallic impurities, the metallic impurities including at least Al, but an amount of the metallic impurity of which content is the largest among the metallic impurities contained in the liquid is 50 ppb or less.

14. The light emitting material as claimed in claim 13, wherein the amount of the Al contained in the liquid is more than 1 ppb but 20 ppb or less.

15. The light emitting material as claimed in claim 13, wherein the Al complex is 8-hydroxyquinoline aluminum.

* * * * *